Figure 1:
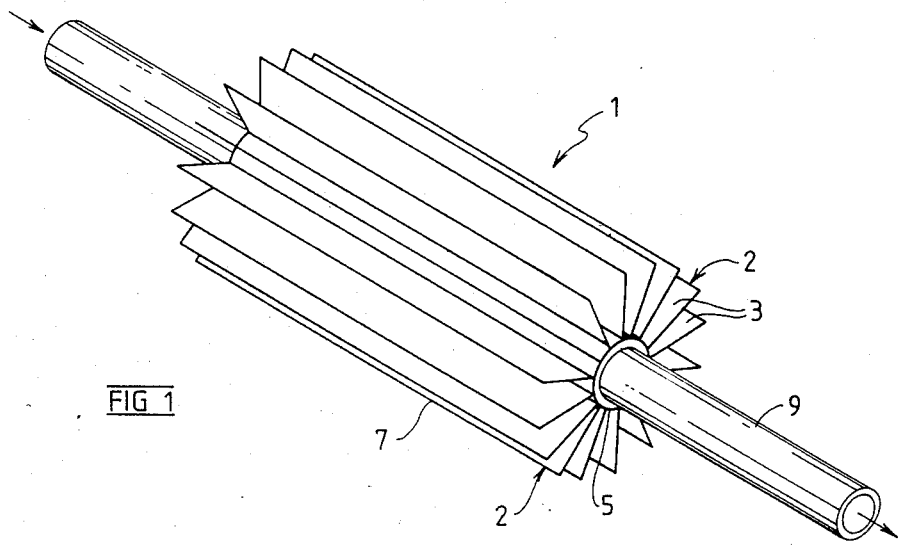

United States Patent [19]

Swarbrick

[11] Patent Number: 4,673,863

[45] Date of Patent: Jun. 16, 1987

[54] THERMOELECTRIC GENERATOR FOR ENGINE EXHAUST

[76] Inventor: Alan Swarbrick, No. 3 Residence, "Colanda", Colac, Victoria 3250, Australia

[21] Appl. No.: 829,657

[22] PCT Filed: May 22, 1985

[86] PCT No.: PCT/AU85/00111

§ 371 Date: Jan. 23, 1986

§ 102(e) Date: Jan. 23, 1986

[87] PCT Pub. No.: WO85/05406

PCT Pub. Date: Dec. 5, 1985

[30] Foreign Application Priority Data

May 24, 1984 [AU] Australia ............................. PG5159

[51] Int. Cl.$^4$ ....................... F01N 5/02; H01L 35/30
[52] U.S. Cl. ................................... 322/2 R; 136/208
[58] Field of Search ...................... 322/2 R; 320/61; 136/208

[56] References Cited

U.S. PATENT DOCUMENTS

| 1,118,269 | 11/1914 | Creveling | 322/2 R |
| 2,362,259 | 11/1944 | Findly | 322/2 R X |
| 3,297,492 | 1/1967 | Pepper | 136/208 |
| 4,095,998 | 6/1978 | Hanson | 136/208 |
| 4,204,882 | 5/1980 | Howell | 136/282 |

*Primary Examiner*—R. J. Hickey
*Attorney, Agent, or Firm*—Sughrue, Mion, Zinn, Macpeak and Seas

[57] ABSTRACT

A voltage generator (1) which is adapted to be mounted on the exhaust pipe (9) of a motor vehicle comprises a plurality of thermocouples mounted on support fins (3) the hot junctions of the thermocouples being adjacent the longitudinal edge (5) of the fins (3) closest to the exhaust pipe (9) and the cold junctions being adjacent the longitudinal edge (7) of the fins (3) which is remote from exhaust pipe (9). The arrangement is such that the heat of the exhaust gases causes a voltage to be produced by the thermocouples.

2 Claims, 2 Drawing Figures

U.S. Patent  Jun. 16, 1987  4,673,863

THERMOELECTRIC GENERATOR FOR ENGINE EXHAUST

This invention relates to an improved generator and more particularly to a voltage generator which is suitable for use with engines such as, for example, internal combustion engines.

One particular application of the present invention is in connection with motor vehicles and it will be convenient to describe the invention with reference to that particular application. It is to be understood, however, that this is not to be taken as a limitation on the scope of the invention as it will be readily apparent that the voltage generator could be used in a wide variety of applications.

Motor vehicles are generally fitted with an electrical generator for meeting the electrical requirements of the vehicle. The generator is usually in the form of an alternator which produces alternating current or in some cases in the form of a dynamo which produces direct current. Both devices are relatively complicated in their structure and because of the number of moving parts tend to suffer from mechanical failure.

It is an object of the present invention to provide an improved generator which is suitable for use with internal combustion engines which alleviate one or more of the aforementioned problems.

According to the present invention there is provided a voltage generator suitable for use with engines which in operation have relatively hot zones the voltage generator comprising a plurality of thermocouples having alternating hot and cold junctions, characterized in that said thermocouples are arranged in electrical series and/or parallel with said hot junctions being disposed adjacent a relatively hot zone of the engine, said cold junctions being spaced from the relatively hot zone so that the heat of the engine in the hot zone causes a voltage to be produced by the plurality of thermocouples.

Preferably, the relatively hot zone of the engine is a waste heat zone such as the engine exhaust.

In a preferred form, the thermocouples are mounted on support members in banks. Preferably, the support members are in the form of elongated fins having one longitudinal edge mounted in the hot zone with the fin projecting away from the hot zone said one longitudinal edge having the hot junctions at or adjacent thereto the other longitudinal edge having the cold junctions of the thermocouples at or adjacent thereto.

Where the generator is used in association with the engine exhaust the inner longitudinal edge of each fin abuts against the exhaust pipe of the engine and said outer longitudinal edge projects away therefrom.

Preferably, a plurality of fins are provided which are arranged on the exhaust pipe, the fins being circumferentially disposed therearound and projecting radially therefrom.

More preferably 20 fins are provided around the exhaust pipe of the engine each fin containing at least a hundred thermocouples thereon, the outer longitudinal edges of the fins being spaced apart so that air can freely pass along and between the outer edge portions of each fin.

Figure 2:
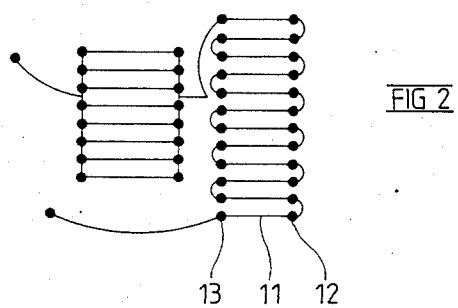

Preferred embodiments of the invention will hereinafter be described with reference to the accompanying drawings in which:

FIG. 1 is a schematic perspective view of a generator according to the invention; and FIG. 2 is a diagram of one proposed array of thermocouples for use in the generator of the present invention.

Referring to the drawings, the generator of the present invention generally indicated at 1 comprises a plurality of thermocouples 11 having alternating hot and cold junctions 12 and 13, the thermocouples 13 being arranged in electrical series and/or parallel (see FIG. 2). The hot junctions of the thermocouples are mounted adjacent a relatively hot zone of the engine when the engine is in operation, the cold junctions being spaced from the relatively hot zone so that the heat of the engine in the hot zone causes a voltage to be produced by the plurality of thermocouples. Preferably, the heat zone of the engine is, as shown, a waste heat zone such as the engine exhaust or the like.

As shown, the thermocouples are mounted on support members 2 in banks. The support members are in the form of elongated fins 3 having one longitudinal edge 5 mounted in the hot zone with the fin projecting away from the hot zone, the other longitudinal edge 7 having the cold junctions of the thermocouples disposed thereat. In a preferred form as shown the fins 3 are mounted with the inner longitudinal edge abutting against the exhaust pipe 9 of the internal combustion engine and the outer longitudinal edge projecting away therefrom. As shown, a plurality of fins 3 are arranged on the exhaust pipe 9 the fins being circumferentially disposed therearound. The inner longitudinal edge 5 of each fin 3 may be bonded to the others so as to collect maximum heat. Whilst it is appreciated that any number of fins could be utilized, in one particular arrangement 20 fins are provided around the exhaust pipe of the engine each fin containing a hundred thermocouples thereon. A convenient size of the fin is 30 cm by 6 cm. Preferably, the outer longitudinal edges of the fins are spaced apart so that air can freely pass along and between the outer edge portions of each fin and thereby facilitate more efficient heat exchange.

It will be appreciated that many types of thermocouples would be suitable for use in the generator of the present invention, however, examples of two preferred forms are the nickle chromium thermocouple or nickle aluminium thermocouple the properties which are set out in the British Standard 1827. These particular thermocouples are capable of generating a voltage of 10.57 mv each at a temperature of 200° C.

It is preferable that a number of the thermocouples are arranged in series and a further group are arranged in parallel (see FIG. 2) so as to obtain maximum current and voltage. It is proposed that the generator of the present invention could be used as a boost to normal electrical generation or alternatively to completely substitute for the now known rotary generator.

It will be appreciated from the foregoing the generator of the present invention exhibits many advantages over the prior art devices. For example, because there are no moving parts, there is a reduction in the wear of the device. Furthermore, the engine which is normally used to drive the generator does not have to in the case of the present invention and therefore there is a reduction in fuel consumption. Furthermore, the device owing to its lack of moving parts and simple structure would have a long life.

I claim:

1. A voltage generator comprising a bank of elongate fins arranged with their longitudinal axes substantially parallel, each fin having a first longitudinal edge in direct heat transfer relation with a source of waste heat emitted from an engine such that a relatively high temperature zone exists at the first longitudinal edge portion, and a second longitudinal edge opposed to the first edge and remote from the heat source, the said second edges being unenclosed free edges, the bank of fins being located within an air flow such that cooling air can pass freely along the fins so that the fins are cooled and a relatively low temperature zone exists at the second edge portion of each fin, and a multiplicity of thermocouples mounted on each fin, each thermocouple having one junction in the high temperature zone of the fin, and a second junction in the low temperature zone of the fin.

2. A voltage generator as claimed in claim 1 wherein the fins are arranged around an exhaust pipe of an engine with the longitudinal axes of the fins extending parallel to the axis of the pipe, the first longitudinal edges of the fins being in direct heat exchange relation with the pipe and the second longitudinal edges being disposed radially outwardly of the first edges.

* * * * *